United States Patent
Akil et al.

(10) Patent No.: US 8,320,192 B2
(45) Date of Patent: Nov. 27, 2012

(54) MEMORY CELL, A MEMORY ARRAY AND A METHOD OF PROGRAMMING A MEMORY CELL

(75) Inventors: Nader Akil, Sterrebeek (BE); Michiel Van Duuren, Valkenswaard (NL)

(73) Assignee: NXP B.V., Eindhoven (NL)

( * ) Notice: Subject to any disclaimer, the term of this patent is extended or adjusted under 35 U.S.C. 154(b) by 364 days.

(21) Appl. No.: 12/594,595

(22) PCT Filed: Apr. 1, 2008

(86) PCT No.: PCT/IB2008/051210
§ 371 (c)(1),
(2), (4) Date: Oct. 3, 2009

(87) PCT Pub. No.: WO2008/122919
PCT Pub. Date: Oct. 16, 2008

(65) Prior Publication Data
US 2010/0128536 A1    May 27, 2010

(30) Foreign Application Priority Data
Apr. 5, 2007 (EP) .................... 07105781

(51) Int. Cl.
*G11C 11/34* (2006.01)
(52) U.S. Cl. ............... 365/185.28; 365/185.29; 365/184
(58) Field of Classification Search ............. 365/185.28, 365/185.29, 184, 185.19, 185.18, 189.01, 365/129, 185.05, 215, 189.05
See application file for complete search history.

(56) References Cited

U.S. PATENT DOCUMENTS

| | | | |
|---|---|---|---|
| 6,606,265 B2* | 8/2003 | Bergemont et al. | 365/185.01 |
| 6,934,190 B1 | 8/2005 | Liu et al. | |
| 7,218,554 B2* | 5/2007 | Hsu et al. | 365/185.25 |
| 7,573,742 B2* | 8/2009 | Ajika et al. | 365/185.05 |
| 2002/0019097 A1* | 2/2002 | Arai et al. | 438/257 |
| 2003/0081460 A1 | 5/2003 | Choi et al. | |
| 2003/0198086 A1 | 10/2003 | Shukuri | |
| 2004/0100826 A1 | 5/2004 | Cho | |
| 2004/0129985 A1 | 7/2004 | Lee et al. | |
| 2004/0155234 A1 | 8/2004 | Ishimaru et al. | |
| 2005/0265080 A1 | 12/2005 | Hisamoto | |
| 2005/0282332 A1 | 12/2005 | Hsu et al. | |
| 2006/0043469 A1* | 3/2006 | Park et al. | 257/324 |
| 2006/0114724 A1* | 6/2006 | Riedel et al. | 365/185.27 |
| 2007/0291527 A1* | 12/2007 | Tsushima et al. | 365/148 |
| 2008/0185615 A1* | 8/2008 | Wu | 257/213 |
| 2008/0285350 A1* | 11/2008 | Yeh | 365/185.17 |

OTHER PUBLICATIONS

Wang, Y, et al; "A Novel SONOS Nonvolatile Flash Memory Device Using Substrate Hot-Hole Injection for Write and Gate Tunneling for Erase"; Solid State Electronics; Elsevier Science Publishers; Barking, GB; vol. 48, No. 10-11, Oct. 1, 2004; pp. 2031-2034.

* cited by examiner

*Primary Examiner* — Dang Nguyen (57) ABSTRACT

A method of programming a memory cell (100), the method comprising applying a first electric potential to a first electric terminal (101) of the memory cell (100) to accelerate first charge carriers of a first type of conductivity to thereby generate second charge carriers of a second type of conductivity by impact ionisation of the accelerated first charge carriers, and applying a second electric potential to a second electric terminal (102) of the memory cell (100) to accelerate the second charge carriers to thereby inject the second charge carriers in a charge trapping structure (103) of the memory cell (100).

21 Claims, 5 Drawing Sheets

MEMORY CELL, A MEMORY ARRAY AND A METHOD OF PROGRAMMING A MEMORY CELL

FIELD OF THE INVENTION

The invention relates to a memory cell.
Moreover, the invention relates to a memory array.
Beyond this, the invention relates to a method of programming a memory cell.

BACKGROUND OF THE INVENTION

The storage of information on computer systems and in embedded chips for smartcards, etc. becomes more and more important. Particularly, flash memory arrays may be employed for this purpose.

SONOS (silicon-silicon oxide-silicon nitride-silicon oxide-silicon) and charge trapping memories in general (for instance nanocrystals, SONOS with one or more layers made of a high k-material, etc.) are serious candidates for embedded and stand alone non-volatile memories in the 45 nm CMOS generation and beyond, thanks to the ease of integration in the CMOS flow and the low program and erase voltages compared to floating gate devices.

However, data retention of SONOS memory cells may be insufficiently small. In fact, SONOS cells are operated by direct tunneling in both programming and erasing. An advantage of direct tunneling is that it requires extremely low current values (in the order of magnitude of pico amperes) so that a large amount of cells (for instance more than $10^6$ cells) may be programmed or erased at the same time, at the expense of relatively high voltages (for instance 10 V to 13 V). However, when implementing direct tunneling processes, the bottom silicon oxide thickness of a SONOS transistor cannot be increased above approximately 2.5 nanometer (nm) to improve the data retention time because the hole tunneling from the substrate to the silicon nitride during erasing may become extremely low and the erasing may become inefficient.

Figures 1, 2, 3:
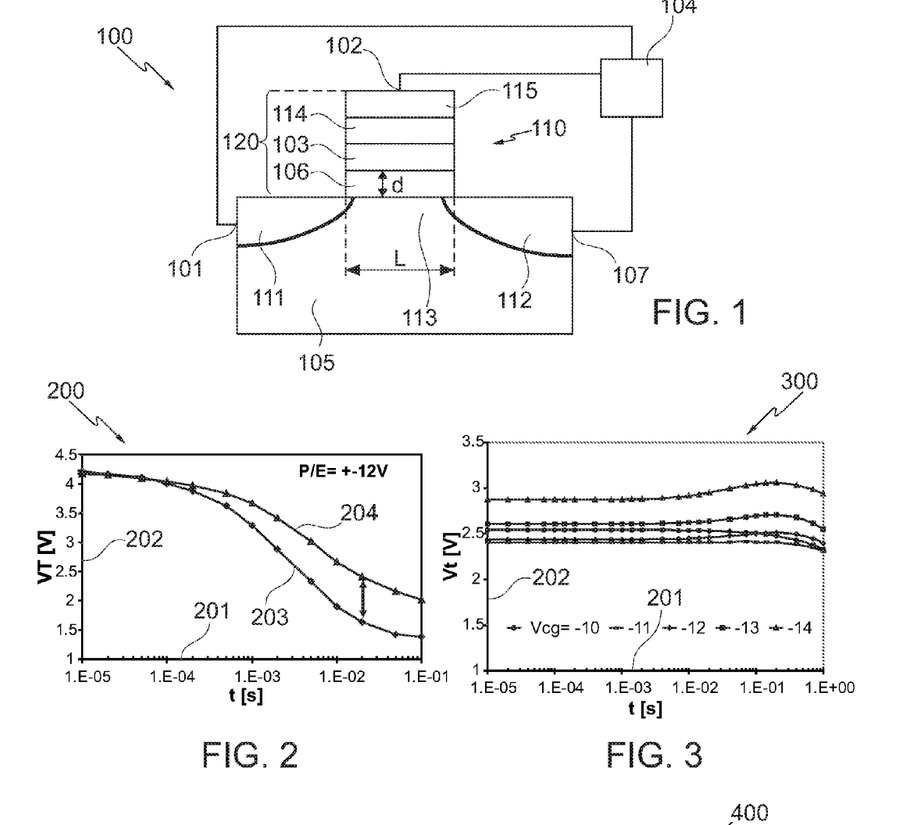
FIG. 1 illustrates a schematic view of a memory cell according to an exemplary embodiment of the invention.
FIG. 2 and FIG. 3 are diagrams illustrating erase curves indicative of an erasing of a conventional SONOS device.

Such a scenario is shown in a diagram 200 illustrated in FIG. 2.

The diagram 200 comprises an abscissa 201 along which a time is plotted in seconds. Along an ordinate 202, a threshold voltage $V_T$ is plotted in Volt. A first curve 203 is assigned to a bottom oxide having a thickness of approximately 2.2 nm, whereas a second curve 204 is assigned to a bottom oxide having a thickness of approximately 2.4 nm. FIG. 2 illustrates erase curves 203, 204 obtained by tunneling in SONOS devices with 2.2 nm/6 nm/8 nm and 2.4 nm/6 nm/8 nm ONO (silicon oxide-silicon nitride-silicon oxide) stacks. The curves 203, 204 are very sensitive to bottom oxide thickness.

FIG. 3 illustrates a diagram 300 for a bottom oxide having a thickness of 3 nm and showing different curves correlated to different control gate voltages $V_{cg}$. FIG. 3 shows erase curves for a SONOS device with a 3 nm/6 nm/8 nm ONO stack for different gate voltages. As may be taken from FIG. 3, erase is simply not possible.

From FIG. 2 and FIG. 3, it may be taken that it may be very difficult to improve the retention time of a SONOS device operated by tunneling procedures.

US 2004/0155234 A1 discloses a non-volatile semiconductor memory device comprising an ONO film constituted by a silicon nitride film for accumulating charge and by oxide films disposed thereon and thereunder, a memory gate electrode disposed at an upper portion thereof, a select gate electrode disposed at a side portion thereof through the ONO film, a gate oxide film disposed thereunder. By applying a potential to a select gate electrode of a memory cell having a source region and a drain region and to the source region and by accelerating electrons flowing in a channel through a high electric field produced between a channel end of the select memory transistor and an end of an n-type doped region disposed under the memory gate electrode, hot holes are generated by impact ionization, and the hot holes are injected into a silicon nitride film by a negative potential applied to the memory gate electrode, and thereby an erase operation is performed.

However, the retention time of a memory arrangement according to US 2004/0155234 A1 may be insufficient.

OBJECT AND SUMMARY OF THE INVENTION

It is an object of the invention to provide a memory having a sufficiently long retention time.

In order to achieve the object defined above, a memory cell, a memory array, and a method of programming a memory cell according to the independent claims are provided.

According to an exemplary embodiment of the invention, a method of programming a memory cell is provided, the method comprising applying a first electric potential (for instance a positive voltage) to a first electric terminal (for instance a source/drain region of a memory transistor) of the memory cell to accelerate (for instance by an electric force) first charge carriers of a first type of conductivity (for instance electrons) to thereby generate second charge carriers of a second type of conductivity (for instance holes in a semiconductor substrate) by impact ionisation of the accelerated first charge carrier, and applying a second electric potential (for instance a negative voltage) to a second electric terminal (for instance a gate region of a memory transistor) of the memory cell to accelerate (for instance by an electric force) the second charge carriers to thereby inject (for example by tunneling) the second charge carriers (particularly after transmission of the accelerated second charge carriers through a gate oxide layer) in a charge trapping structure (for instance an electrically insulating structure such as a silicon nitride layer) of the memory cell.

According to another exemplary embodiment of the invention, a memory cell (which may be monolithically integrated in a substrate such as a silicon wafer or chip) is provided, the memory cell comprising a first electric terminal, a second electric terminal, a charge trapping structure and a programming unit (such as a voltage control unit) adapted for applying a first electric potential to the first electric terminal to accelerate first charge carriers of a first type of conductivity to thereby generate second charge carriers of a second type of conductivity by impact ionisation of the accelerated first charge carriers, wherein the programming unit is adapted for applying a second electric potential to the second electric terminal to accelerate the second charge carriers to thereby inject the second charge carriers in the charge trapping structure.

According to another exemplary embodiment of the invention, a memory array is provided, the memory array comprising a plurality of memory cells having the above-mentioned features and formed in a (common) substrate. Such a memory array may comprise a plurality of matrix-like arranged memory cells that may be controlled individually using word lines and bit lines.

The term "memory cell" may particularly denote a physical structure (such as a layer sequence) that allows storing information in an electronic manner. An amount of information stored in a memory cell may be 1 bit (which may be encoded, for instance, in the presence or absence of charge carriers in a dedicated structure) or may be more than 1 bit (which may be encoded, for instance, in the amount of stored charge and/or the type of the charge carriers, that is to say positively or negatively charged charge carriers).

The term "substrate" may denote any suitable material, such as a semiconductor, glass, plastic, etc. According to an exemplary embodiment, the term "substrate" may be used to define generally the elements for layers that underlie and/or overlie a layer or portions of interest. Also, the substrate may be any other base on which a layer is formed, for example a semiconductor wafer such as a silicon wafer or silicon chip. However, a substrate may also have an electrical function, in the context of the generations of electrons or holes.

The term "charge storage structure" or "charge trapping structure" may particularly denote a structure that is specifically adapted to allow introducing electric charge in this structure by tunneling or other motion schemes. The charge storage structure may be adapted in a manner that this charge is stored and remains stored within the structure for a sufficiently long time. Examples for appropriate charge storage structures are a nitride layer of an ONO layer sequence, nanocrystals, etc. Also electrically conductive charge storage structures such as a floating gate may fall under the scope of embodiments of the invention.

The term "source/drain region" may particularly denote a source region or a drain region. Since the functionality of a source region and a drain region may depend on the operation mode of a memory transistor, for instance voltages applied thereto, the term source/drain region may denote a structure which may act as a source region or as a drain region.

The term "programming" may particularly denote selectively injecting charge carriers in a charge trapping structure in a manner to allow the memory cell in the programmed state to store the information of at least one bit. In other words, after programming, the information is stored in a readable manner in the charge trapping structure. Programming may be a procedure that is performed individually for each memory cell of a memory array. In contrast to this, an erasing procedure may be performed in common for a plurality of memory cells at the same time.

The term "charge carriers" may particularly denote electrically positively charged particles or quasi-particles in a solid substrate (such as holes) or electrically negatively charged particles (such as electrons).

The term "first type of conductivity" and "second type of conductivity" may denote that current is carried by positive or negative mobile charge carriers, or vice versa.

The term "impact ionisation" may particularly denote a phenomenon that accelerated charge carriers (particularly electrons) having sufficient energy may interact with the material of a substrate (for instance a silicon substrate such as a wafer or an electronic chip) so that electron-hole pairs are generated. Depending on the voltage applied to the second electric terminal, one charge type of the generated pairs (for instance holes) may be accelerated towards a charge trapping structure and may be accumulated in the charge trapping structure.

According to an exemplary embodiment of the invention, a scheme of programming a memory cell may be provided. Firstly, charge carriers (for instance electrons) are accelerated by applying a first voltage to a dedicated terminal, particularly between two source/drain regions of a memory transistor. When a suitable second electrical potential is then applied to another dedicated terminal, particularly the gate terminal of the memory transistor, second charge carriers (for instance holes) generated by impact ionisation may tunnel even through a relatively thick silicon oxide layer into a charge trapping structure such as a silicon nitride layer of an ONO (silicon oxide-silicon nitride-silicon oxide) layer sequence. Information to be stored in such a memory cell may be encoded in the presence or absence, in the amount and/or in the charge type of the electrically charged particles trapped in the charge trapping layer. This information may be read out by applying a sampling voltage to the memory transistor (and/or by applying a sampling voltage to an access transistor), and the amount of the flowing current (between source and drain) then depends on the previous programming scheme. Since the hot hole injection procedure triggered by impact ionisation allows the use of a thick gate insulating layer of the memory transistor, the data retention time may be significantly increased using embodiments of the invention.

Therefore, according to an exemplary embodiment of the invention, a programming scheme for charge trapping non-volatile memories using punch-through assisted hot holes injection is provided. A programming scheme particularly for a SONOS device or a charge trapping memory in general (for instance a nanocrystal, SONOS with one or multiple layers of high k-materials) meant for one time or multiple time programmable non-volatile memory applications is provided. The programming may be done by hot holes generated by impact ionisation. The programming may be performed selectively and may bring the threshold voltage of selected cells to a lower voltage level.

An erase may be done in a non-selective way using tunneling of electrons from the substrate to the silicon nitride layer bringing the threshold voltage of all cells to a higher voltage level. According to an exemplary embodiment, an access transistor such as a MOS transistor may be placed next to every SONOS transistor in serial and may be used as a current limiting element (for instance as a passive device which may reduce a current, but which does not produce current) during programming. Such a transistor may also act as a selection element (for instance during reading, or during writing).

The SONOS device may have a relatively thick gate insulating layer or bottom oxide (for instance having a thickness of larger than 3 nm) to improve memory retention and may have a gate length or effective gate length below 150 nm to render the programming very efficient (the shorter the gate length, the better the function of the device). Compared to conventional methods using hot holes to program a SONOS device with a thick bottom oxide, such as band-to-band tunneling for instance, the mechanism according to an exemplary embodiment of the invention allows much more effective programming which may result in a faster programming and a better memory endurance.

According to an exemplary embodiment of the invention, a method of operating a memory device comprising a (for instance SONOS) memory cell is provided, the method comprising programming a selected (for instance SONOS) memory cell including applying a predetermined positive drain voltage to a drain terminal of the selected (for instance SONOS) memory cell to cause a drain field and applying a predetermined negative gate voltage to a control gate terminal of the selected SONOS memory cell to cause a punching effect, wherein the negative voltage may be of such a value as to cause electrons accelerated by the drain field to generate impact ionisation events on their way to the drain. Between source and drain, an applied voltage may induce impact ionisation. Between gate and the lower one of source and drain, a voltage may induce introduction of charge carriers in the charge storage structure. Also, the gate may be negative with respect to the substrate.

"Impact ionisation" may denote an effect that highly energetic electrons colliding with ions/atoms in a lattice may generate positively charged holes (or "missing" electrons).

Thus, a programming scheme to program a SONOS device having a thick bottom oxide (for instance 3 to 8 nm) to provide proper data retention characteristic may be provided. The method provides for a fast programming and may be efficient also when the gate length is scaled down. Therefore, embodiments of the invention may be used for OTP (one time programmable)—or MTP (multiple time programmable) non-volatile memories (for instance for an identification system, a microcontroller, etc.).

Thus, according to an exemplary embodiment of the invention, a programming scheme for SONOS OTP-MTP memories is provided using punch-through assisted hot holes. A programming scheme particularly for a SONOS device is provided for programmable non-volatile memory applications. The programming may be done by hot holes generated by impact retention. The SONOS transistor may be a punching transistor at the used drain-source voltage during programming in order to generate hot holes by impact ionisation allowing for a fast programming.

According to an exemplary embodiment of the invention, the memory transistor (for instance a SONOS transistor) may be a punching transistor, that is to say a transistor with electrons flowing from source to drain even when the transistor is off, or even when a negative voltage is applied to the gate.

Hot holes may be generated in such a punching channel by impact ionisation events of electrons flowing from source to drain deep below the interface. Some or all of the generated hot holes may be accelerated by the gate field to be injected in the charge trapping layer to have a symmetrically programmed charge trapping layer such as a silicon nitride layer. Compared to localized injection procedures, the punch-through assisted hot holes may improve the endurance.

Particularly, a voltage difference between source and drain may be adjusted appropriately to accelerate electrons from the source to the drain, or vice versa, producing the impact ionisation.

It is possible to store exactly one bit per SONOS in a two transistor flash architecture, employing an access transistor in series with a SONOS memory transistor. However, alternative transistor architectures, control logic architectures and/or bit per cell characteristics (such as the storage of multiple bits per cell) are possible. Such an access gate transistor may be used during programming to limit the programming current.

According to an exemplary embodiment, selective punch-through assisted hot hole programming and non-selective Fowler-Nordheim erase may be advantageously combined. Thus, according to an exemplary embodiment of the invention, hot holes may be used to program the device and a uniform Fowler-Nordheim procedure to erase the device.

According to an exemplary embodiment of the invention, a control gate may be used. The cell is punching, which means the depletion regions at the source and drain are touching each other and the barrier for electrons at the source side is very low, so that electrons may easily flow from source to drain when the transistor is off. More particularly, the hot holes are generated in the channel by the accelerated electrons by impact ionisation, and hence it is easier for holes to be injected everywhere in the silicon nitride structure which results in a more effective programming. Impact ionisation may occur particularly close to the drain. In case where the channel is short—which may be obtained by a short gate length—the homogeneity of the charge injection into the charge storage structure is high.

According to an exemplary embodiment of the invention, a programming scheme to program a SONOS device with a thick bottom silicon oxide layer (for instance 3 nm to 8 nm) is provided to improve the data retention. Compared to conventional programming methods using hot-holes (such as band-to-band tunneling), the method according to an exemplary embodiment allows for faster programming. It also may solve problems regarding an accumulation of non-erased electrons in the channel of the memory devices after cycling to have better memory endurance. It may become even more efficient when the gate length is scaled down.

Next, further exemplary embodiments of the method will be explained. However, these embodiments also apply to the memory cell and to the memory array.

The first electric terminal may be a first source/drain region, particularly a drain region, of a memory transistor of the memory cell. Thus, a memory (field effect) transistor having two source-/drain regions (that is a source region and a drain region), a gate region and a channel region may be provided. Additionally, the charge trapping structure may be part of such a transistor. In such a scenario, a voltage may be applied between the first terminal assigned to the drain region, and the source region may be kept, for instance, at a reference potential such as the ground potential. Then, the electrons as the first charge carriers may flow between the source and the drain region and may be accelerated rapidly by the applied electric voltage. Being heavily accelerated, energy of these electrons may be transferred to a material of the substrate to thereby generate electron-hole pairs. The holes of these pairs may then be attracted by a voltage applied to the gate of the memory transistor as the second electric terminal, thereby allowing the hot holes to transmit even a thick electrically insulating barrier, to enter the and to be trapped in the charge storage structure, for instance a silicon nitride layer of an ONO layer sequence.

Thus, the second electric terminal may be a gate region or a gate terminal of a memory transistor of the memory cell. Such a memory transistor may be configured as a field effect transistor, but may alternatively also be a bipolar transistor.

The first charge carriers may be negatively charged particles such as electrons and the second charge carriers may be positively charged particles such as holes in a solid-state substrate.

The first electric potential may be a positive electric potential (with respect to a ground potential), particularly may be a positive electric potential having an absolute value of less than or equal to 5V. Thus, a relatively moderate voltage may be sufficient to accelerate the electrons in a sufficient manner to provide for impact ionisation.

The second electric potential may be a negative electric potential (with respect to a ground potential), particularly may be a negative electric potential having an absolute value of less than or equal to 5V. The negative electric potential may be applied to attract and accumulate positively charged particles such as hot holes in the charge trapping layer. Therefore, a relatively low energy programming may be made possible.

The second electric potential may be applied in such a manner that the second charge carriers are injected in the charge trapping structure after tunneling through an electrically insulating structure of the memory cell. Such a tunneling may involve hot hole injection as an efficient programming procedure.

The electrically insulating structure (which may be denoted as a gate insulating structure in a configuration using a memory transistor) of the memory cell may have a thickness between 3 nm and 8 nm for silicon dioxide (the thickness may be different for other materials such as high k materials: here, the thickness may be even larger to obtain the same "electrical thickness"). By having a thickness of at least 3 nm, the retention time of the memory cell may be kept high so that information may be stored reliably for a long time in the memory cell.

The charge trapping structure may be made of an electrically insulating material such as a silicon nitride layer, a silicon nitride layer of an ONO (silicon oxide-silicon nitride-silicon oxide) layer sequence, an ONO layer sequence comprising a high-k material, or a nanocrystal structure. The charge trapping structure may also be made of an electrically conductive material such as a floating gate. A floating gate may be an electrically conductive polysilicon structure surrounded by an electrical insulation, wherein the charges are trapped within the floating gate.

The method may comprise operating an additional access transistor of the memory cell as a current limiting element for programming the memory cell, particularly for limiting a value of an electric current flowing through a memory transistor of the memory cell. Thus, the access transistor may be operated in a manner to limit the amplitudes of the electric signals to which the memory transistor is exposed. This may allow obtaining definable parameters for programming the memory cell, allowing for reducible programming results.

The memory cell may be a non-volatile memory cell. In other words, the memory cell may be a memory cell that is capable of storing information for a sufficiently long time of days or years without the need for a constant supply of electric energy to maintain the information stored.

The method may comprise applying a third electric potential to a third electric terminal of the memory cell to assist acceleration of the first charge carriers between the first electric terminal and the third electric terminal (for instance for an acceleration in a channel region). Thus, a current flow of accelerated electrons may be accomplished between a source region and a drain region, to induce electron-hole pairs in the channel deeply buried within the substrate, and the holes may then be "sucked off" in an electric manner by the attracting potential applied to the gate terminal. This allows for a very efficient programming scheme.

The third electric terminal may therefore be a second source/drain region, particularly a source region, of the memory transistor of the memory cell.

When a length of a gate stack of a memory transistor of a memory cell is sufficiently small, for instance less or equal to 150 nm, the quality of the programming procedure remains high (because of a homogeneous injection of the holes into the nitride), and a high integration density may be made possible.

Furthermore, the memory cell may be erased by (for instance after a previous programming sequence) applying a fourth electric potential to the second electric terminal of the memory cell, particularly by applying a fourth electric potential to the second electric terminal of the memory cell having an absolute value which is larger than the absolute value of the second electric potential. For instance, the fourth electric potential used for erasing information from a pre-programmed memory cell (for instance for overwriting information or for formatting the memory cell) may be in the order of magnitude of between 10 V and 30 V. Therefore, an efficient impact ionisation and hot hole injection programming may be combined with an efficient Fowler-Nordheim erasing in a memory cell according to an exemplary embodiment of the invention.

A plurality of memory cells of a memory array (for instance all memory cells of a memory array) may be erased simultaneously. This may allow for a fast and efficient mass erasure of a complete memory product.

A memory transistor of the memory cell may be a punching transistor that allows using a punching effect for programming. Such a punching transistor may have a conductive channel region even in the absence of an externally applied gate voltage.

For any method step during manufacture of a (monolithically integrated) memory cell according to an exemplary embodiment of the invention, any conventional procedure as known from semiconductor technology may be implemented. Forming layers or components may include deposition techniques such as CVD (chemical vapour deposition), PECVD (plasma enhanced chemical vapour deposition), ALD (atomic layer deposition), or sputtering. Removing layers or components may include etching techniques such as wet etching, vapour etching, etc., as well as patterning techniques such as optical lithography, UV lithography, electron beam lithography, etc.

Embodiments of the invention are not bound to specific materials, so that many different materials may be used. For conductive structures, it may be possible to use metallization structures, silicide structures or polysilicon structures. For semiconductor regions or components, crystalline silicon may be used. For insulating portions, silicon oxide or silicon nitride may be used.

The structure may be formed on and/or in a purely crystalline silicon wafer or on and/or in an SOI wafer (Silicon On Insulator).

Any process technologies, like CMOS, BIPOLAR, BICMOS may be implemented.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DESCRIPTION OF EMBODIMENTS

The illustration in the drawing is schematical. In different drawings, similar or identical elements are provided with the same reference signs.

In the following, referring to FIG. 1, a memory cell 100 according to an exemplary embodiment of the invention will be explained.

The memory cell 100 comprises a first electric terminal 101 serving as a first source-/drain terminal, a second electrical terminal 102 serving as a gate terminal, a charge trapping structure 103 configured as a silicon nitride layer and a programming unit 104. The programming unit 104 may be an integrated circuit or may be a voltage control device provided externally of s silicon substrate 105 of the memory cell. The programming unit 104 is adapted for applying a first electric potential to the first electric terminal 101 to accelerate electrons in a channel region 113 to thereby generate positively charged holes by impact ionisation of the accelerated electrons in the substrate 105. The programming unit 104 is further adapted for (simultaneously or subsequently) applying a second electric potential to the second electric terminal 102 to accelerate the generated holes to thereby inject the positively charged holes in the charge trapping structure 103 after transmission through a gate insulating layer 106.

For instance, the first electric potential may be +5V. The second electric potential may be −5V. By applying these voltages, the generated hot holes may be injected in the charge trapping structure 103 after tunneling through the gate oxide layer 106 made of silicon oxide material. The thickness line "d" of the gate oxide layer 106 may be more than three (3) nm, for instance may be five (5) nm, according to the described embodiment.

For programming, a third electric potential may be applied to a third electric terminal 107 being a second source-/drain terminal of the memory cell 100 to accelerate the electrons between the two source/drain terminals 101 and 107.

For forming the memory device 100, a silicon substrate 105 is provided in which a first source/drain region 111 electrically coupled to the first source-/drain terminal 101 and a second source/drain region 112 electrically coupled to the second source-/drain terminal 107 are formed as doped regions. For example, the channel 113 of the field effect transistor 110 may be a p-type channel, whereas the source/drain regions 111, 112 may be n-doped regions.

A gate stack 120 is provided comprising the silicon oxide layer 106, the silicon nitride layer 103, an electrically insulating layer 114 and the gate layer 115. A length "L" of the gate stack 120 may be less than or equal to 150 nm.

For erasing information stored in the charge structure 103, a fourth electric potential of, for instance, +10V is applied to the second terminal 102 of the memory cell 100. This may induce Fowler-Nordheim tunneling between the charge storage structure 103 and the channel 113, thereby removing previously injected charge from the charge storage structure 103.

More generally, a mechanism to program a SONOS device with a sufficiently thick bottom oxide according to an exemplary embodiment of the invention includes hot holes generated by impact ionisation. Programming a SONOS device by hot-holes is not very sensitive to the bottom oxide thickness since the holes already have a high energy in the silicon and may overcome the oxide barrier relatively easily. For this reason, the bottom oxide thickness of the SONOS may be increased when hot-hole programming is used for better data retention.

However, hot holes generated by a band-to-band tunneling procedure around the drain-source junctions are localized in small areas that make them not very efficient to erase trapped electrons in the middle of the SONOS channel. Such a conventional scenario is shown in FIG. 4.

Figure 4:
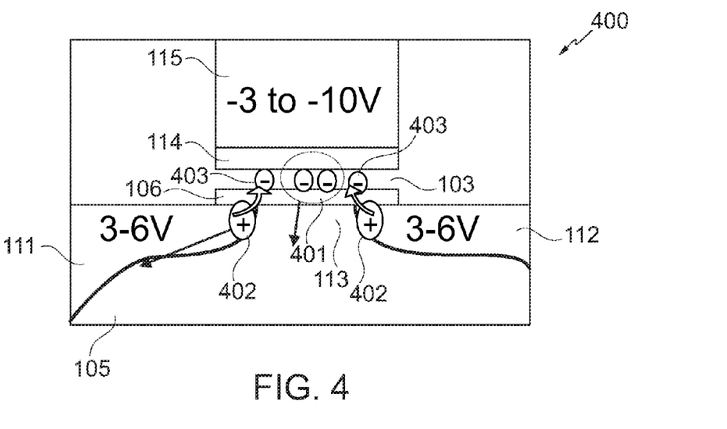
FIG. 4 illustrates voltage conditions to generate hot holes in a conventional NMOS SONOS by band-to-band tunneling.

The memory cell 400 shown in FIG. 4 also shows electrons 401 that cannot be reached by hot-holes 402. Other electrons 403 may be reached by hot-holes 402.

FIG. 4 therefore illustrates voltage conditions to generate hot holes 402 in an NMOS SONOS by band-to-band tunneling. The hot-hole distribution is localized around the junction positions, so only trapped electrons 403 in the nitride layer 103 above the junction positions may be erased efficiently, whereas electrons 401 in the middle of the channel 113 are difficult to be reached by the hot-holes 402.

According to an exemplary embodiment of the invention, a hot hole programming mechanism is provided based on impact ionisation instead of band-to-band tunneling to program the device in a more efficient way. Such a mechanism may allow to obtain, inter alia, the following advantages compared to conventional programming by hot holes generated by band-to-band tunneling:

Efficient erase of the trapped electrons in the middle of the channel, so a faster erase and a larger program window may be accomplished Better endurance Lower substrate doping which means lower virgin threshold voltage and hence a program window which is more symmetric around zero.

Figure 5:
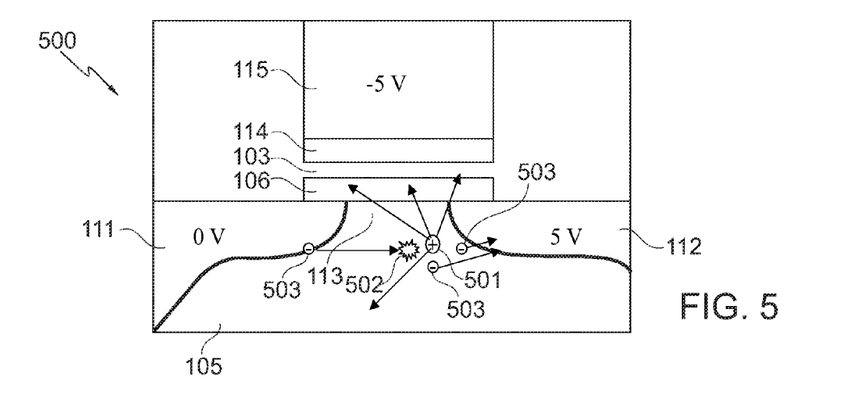
FIG. 5 schematically illustrates a programming scheme of a memory cell according to an exemplary embodiment of the invention.

A programming mechanism according to an exemplary embodiment of the invention involves hot holes generated by impact ionisation events of electrons flowing from the source to the drain (or in opposite direction) deep below the interface as shown in FIG. 5.

FIG. 5 therefore illustrates a memory cell 500 according to an exemplary embodiment of the invention which schematically shows hot holes 501 generated by impact ionisation (schematically illustrated with reference numeral 502) of an electron 503 flowing from source 111 to drain 112 deep below the interface of the punching SONOS transistors 500. The programming scheme illustrated schematically in FIG. 5 may be achieved when a punching control-gate 115 device at high drain 111 to source 112 voltage ($V_{ds}$) is used.

Conventional MOS transistors may suffer from short channel effects (SCE) when the gate length becomes very short. The sub-threshold swing of a conventional MOS transistor (for instance 100 mV/decade), and hence the leakage current when the transistor is off (IOFF) increase when the drain voltage increases. It is presently believed that this is due to so-called drain induced barrier lowering (DIBL). The punching causes a bad sub-threshold swing (see FIG. 6 and FIG. 7).

Figure 6:
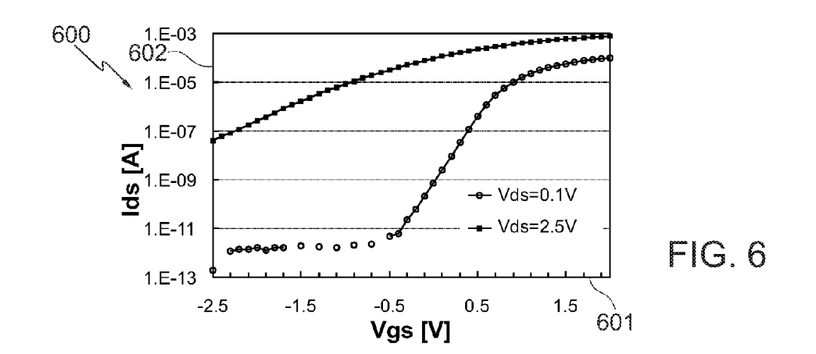
FIG. 6 and FIG. 7 are diagrams showing a transfer characteristic of 16 NMOS SONOS devices in parallel with a 100 nm gate length (FIG. 6) and with a 200 nm gate length (FIG. 7).

FIG. 6 is a diagram 600 having an abscissa 601 along which a gate-source voltage is plotted. Along an ordinate 602, a drain-source current is plotted. Two curves are shown for different drain-source voltages. The curve for the high drain voltage of FIG. 6 illustrates a drain-source current caused by punch-through effects.

Figure 7:
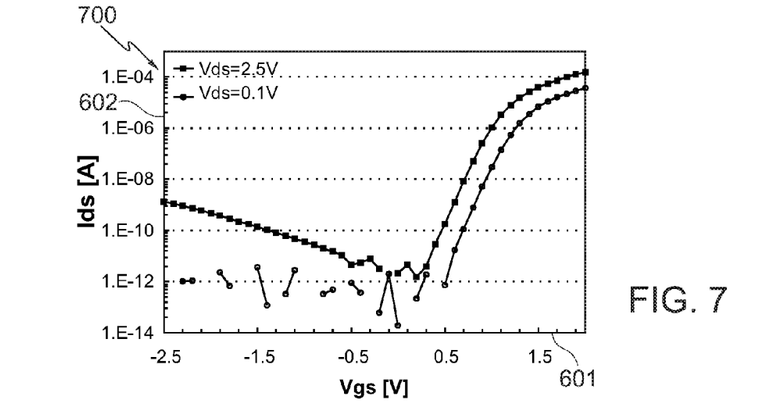

FIG. 7 illustrates similar curves for an identical device but with twice the gate length. Thanks to the longer gate, the subthreshold swing is much better, even at $V_d$=2.5 V, leading to a much lower leakage current at $V_g$=0 V.

More particularly, FIG. 6 illustrates a transfer characteristic of 16 NMOS SONOS devices in parallel with a 100 nm gate length. The device is punching at a high drain-source voltage, that is to say even when −1V is applied to the gate, a drain to source current of about 10 μA flowing to the DIBL effect. FIG. 7 illustrates a transfer characteristic of 16 NMOS SONOS devices in parallel with a 200 nm gate length. The device is not punching at high $V_{ds}$.

In view of the bad sub-threshold swing of the punching device, the punching device shows significant current flows from source to drain even when the transistor is off ($V_{cg}$ is 0V or less than 0V in case of an NMOS). When a large negative voltage is applied to the control gate, the electrons flow deep below the silicon-silicon oxide interface due to the repulsive control gate field as shown in FIG. 8.

Figure 8:
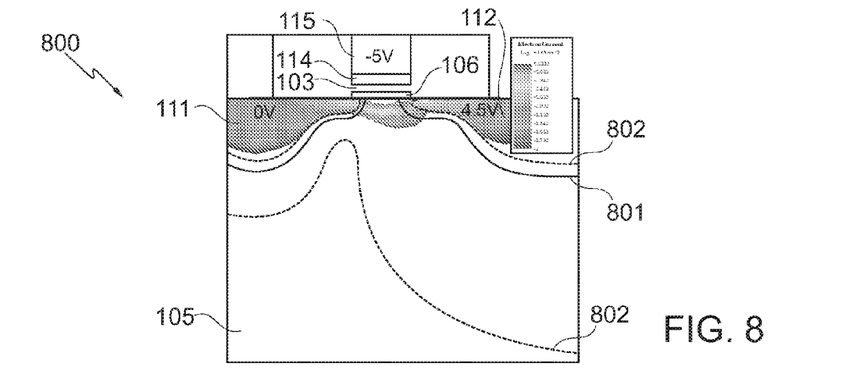
FIG. 8 shows a simulation of a punching SONOS device at high drain-source voltages according to an exemplary embodiment of the invention.

FIG. 8 shows an illustration 800 that is a simulation of a punching SONOS device at high drain-source voltage ($V_{ds}$=4.5V, $V_{gs}$=−5V), where the electrons flow deep below the interface due to the repulsive field of a gate. Metallurgic junction positions are indicated with reference numeral 801, and dotted lines 802 represent depletion edges.

Figure 9:
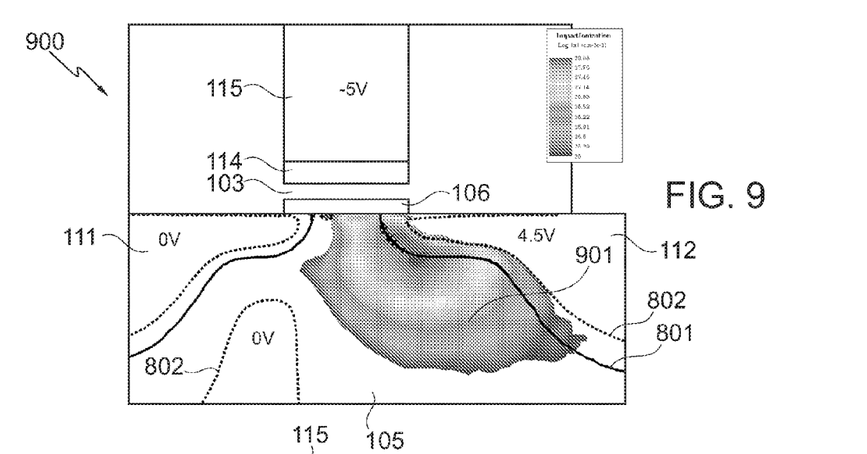
FIG. 9 illustrates a simulation of an impact ionisation region according to an exemplary embodiment of the invention.

A drain field accelerates the electrons over the complete control gate channel length and when they get sufficient energy they cause one or more impact ionisation events on their way from the source to the drain. This may be seen in a simulation of the impact ionisation regime of FIG. 9, in an illustration 900. An impact ionisation region is denoted with reference numeral 901.

During the impact ionisation event, the accelerated electron may lose its energy by generating an electron-hole pair with certain energy. The generated and the initial electrons 503 will be collected by the drain 112 (see FIG. 5), while a part of the generated hot holes 501 will be collected by the substrate 105, but some of the generated hot holes 501 will be accelerated by the negative gate field and gain sufficient energy to overcome the bottom oxide barrier 106 to be injected into the silicon nitride layer 103.

Figure 10:
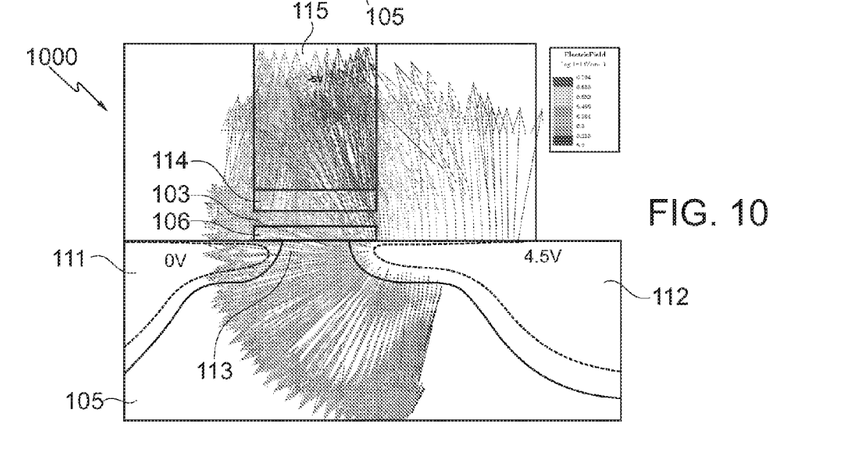
FIG. 10 illustrates a simulation of the orientation of the electric field in a structure when impact ionisation takes place according to an exemplary embodiment of the invention.

FIG. 10 shows an image 1000 simulating the orientation of the electric field in the structure when impact ionisation takes place.

The positively charged holes flow in the direction of the electric field, while the negatively charged electrons flow is in the opposite direction. The electric field is favourable for the holes to be accelerated and injected into the nitride layer 103.

In other words, FIG. 10 illustrates a simulation of the electric field orientation across the channel 113 and the nitride layer 103 or ONO stack. FIG. 10 shows that the orientation of the electric field is very favourable to have holes injected everywhere in the nitride structure. In case of small gate channels, this mechanism becomes even more effective and holes may be injected in the entire nitride structure.

Thus, hot-holes generated by impact ionisation may be used as a programming mechanism to modify (particularly to lower) the threshold voltage of well-defined (selected) devices in a memory array. The array erasures this may be done in a non-selective way (all cells are erased) by bringing the threshold voltage $V_T$ of all cells to high level. The array erasure may be done by biasing all gates at a high positive voltage (for instance between +10 V to +20V depending on a thickness of a bottom and top oxide), so direct tunneling or Fowler-Nordheim mechanisms may take place and electrons may tunnel from the inversion layer through the bottom oxide into the nitride layer.

Table 1 gives exemplary voltage requirements to program selectively a device and to erase the entire memory block or sector according to an embodiment of the invention. WL stands for "word line", which is in this case the control gate line, and BL stands for "bit line" which is in this case the drain.

TABLE 1

Voltage requirements for programming and erasing a flash memory array according to an exemplary embodiment of the invention.

|  | WL selected | WL non selected | BL selected | BL non selected | Vsource | Vbulk |
|---|---|---|---|---|---|---|
| Erase | +10 V to +20 V | Does not exist | 0 V | Does not exist | 0 V | 0 V |
| Program | −3 V to −10 V | 0 V to −2 V | +3 V to +6 V | 0 V | 0 V | 0 V |

Since no selection has to be done for erasure, erase may be done by another way such as UV erase.

So far, a memory array for a 1T (one transistor) SONOS has been discussed. However, in case of a 1T SONOS memory array, under undesired circumstances, several challenges may occur when programming with hot-holes generated by impact ionisation. These challenges are summarized as follows:

During programming of the selected device, holes are injected in the silicon nitride layer and the device may switch from the off-state to an on-state when the threshold voltage becomes very negative, even when a negative voltage is applied to the control gate. In this case, a very high current may flow in the device and the device is "on" under high drain-source voltage conditions (for instance 5V). This may have an impact on the power consumption during programming. Also this may cause injection of electrons in the silicon nitride instead of holes because a main current contribution may include hot electrons near the drain junction, and the gate field is favourable for electrons due to the presence of hole in the silicon nitride structure.

Figure 11:
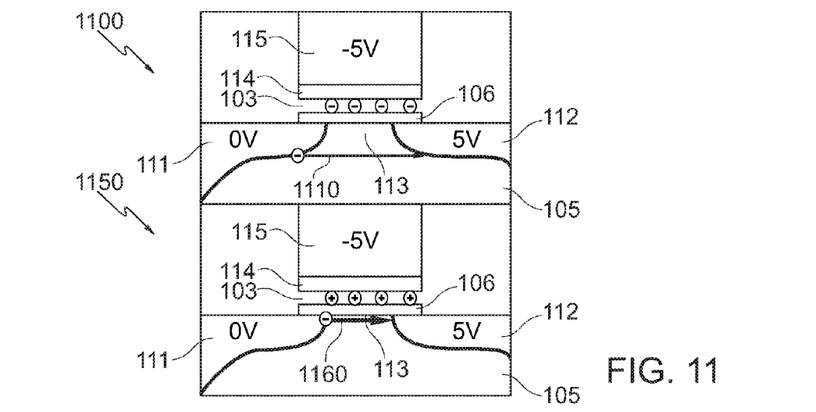
FIG. 11 illustrates an exemplary embodiment of the invention showing charge and current situations in a 1T SONOS cell at the start of programming of an erased device (upper figure) and when the threshold voltage of the device becomes very negative and the device is switched on (lower figure).

FIG. 11 shows a first illustration 1100 and a second illustration 1150.

FIG. 11 shows charge and current situations for a 1T SONOS situation. In the illustration 1100 this is shown at the start of the programming of an erased device. In the illustration 1150 this is shown when the threshold voltage of the device becomes very negative and the device is switched on. In the case of the illustration 1100, the current (schematically illustrated by an arrow 1110) is very low (punch-through current when the device is off), whereas in the illustration 1150 the current (schematically illustrated by an arrow 1160) is very high (the on-current). The high current flowing in the device may have an impact on the reliability of the device, due to device degradation by a large current of hot carriers.

Other challenges are the non-selected cells sharing the same bit line. Those cells are also punching because the high drain voltage influences them. The control gate voltage of non-selected cells cannot be very negative, otherwise the device starts to be programmed. It may be between 0 V and −2 V (see Table 1), but with this voltage, the device will carry out a very high current. So power consumption and disturbance of programming are issues when a 1T configuration is used.

According to an exemplary embodiment, to overcome the remaining problems mentioned above, it is possible to place a MOS transistor (which may be denoted as an access transistor) next to every SONOS transistor. This is called a 2T memory configuration capable of overcoming over-erase-related issues. During programming by hot holes generated by impact ionisation, the access gate of the access transistor may be biased in a way to limit the current flowing from source to drain to a certain value regardless of the threshold voltage of the control gate transistor. In other words, the access gate may be used as a current limiter where the electron current is used to generate the impact ionisations defined and controlled over the whole programming duration by the access gate transistor.

Figure 12:
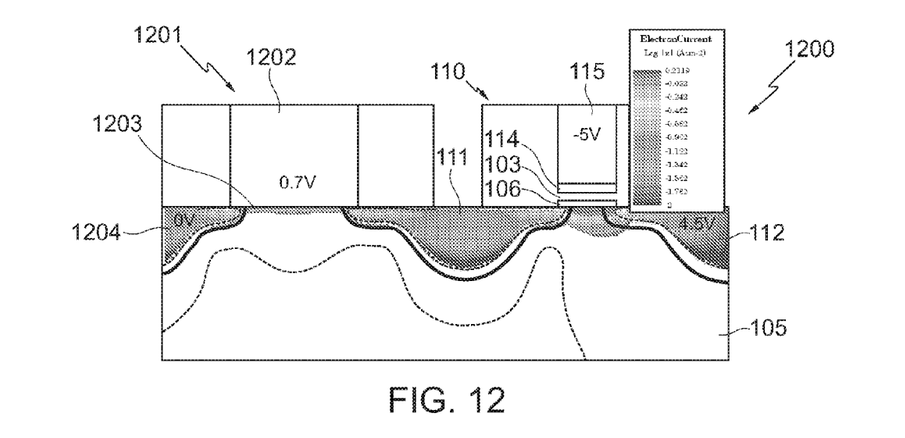
FIG. 12 shows a simulation of current flowing in a 2T SONOS device according to an exemplary embodiment of the invention.

FIG. 12 shows a corresponding memory cell and a simulation 1200 of an electron current flowing in a 2T (two transistor) SONOS device operated in programming conditions.

More particularly, FIG. 12 shows a simulation of a current flowing in a 2T SONOS device, wherein the SONOS transistor is punching and the electrons are flowing below the interface. A gate terminal 1202 of an access transistor 1201 is biased slightly above a threshold voltage to act as a current limiter and to control the current.

The access transistor 1201 comprises the access gate 1202 and a corresponding gate insulating layer (gate oxide layer) 1203. Furthermore, an additional source-/drain region 1204 is provided. The role of the access transistor 1201 is to set the voltage of the source 111 of the control transistor 110/drain 111 of the access transistor 1201 to have a fixed current flow. This may result in a much better control of the programming action compared to the 1T case. The access transistor 1201 may be a robust transistor and may be used to switch-off effectively the source to drain electron current of non-selected cells, so no holes will be generated and the program disturb may be very low.

Table 2 gives exemplary voltage conditions to program a SONOS device in a 2T NOR configuration using hot holes generated by impact ionisation as programming mechanism. Of course, the SONOS device shall be punching at the used programming voltage $V_{ds}$ to make the programming with hot holes generated by impact ionisation working. In Table 2, WL stands for access gate lines, and not for control gate lines as was in the case with the 1T solution.

TABLE 2

Voltage requirements for programming and erasing of a flash memory array using a 2T NOR configuration according to an exemplary embodiment of the invention.

|  | WL selected | WL non selected | CG selected | CG non selected | BL selected | BL non selected | Vsource | Vbulk |
|---|---|---|---|---|---|---|---|---|
| Erase | 0 | Does not exist | +10 V to +20 V | Does not exist | 0 V | Does not exist | 0 V | 0 V |
| Program | 0.5 V to 3 V | 0 V | −3 V to −10 V | 0 V | +3 V to +6 V | 0 V | 0 V | 0 V |

Figure 13:
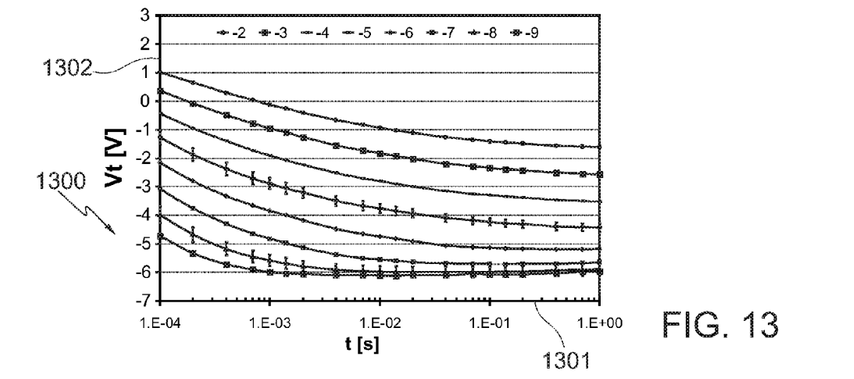
FIG. 13 illustrates programming curves of a SONOS cell according to an exemplary embodiment of the invention.

FIG. 13 shows a diagram 1300 having an abscissa 1301 along which the time is plotted. Along an ordinate 1302, the threshold voltage $V_t$ is plotted in V.

FIG. 13 shows measured programming curves of punching SONOS devices in a 2T configuration at $V_{ds}$ of 5V. The ONO stack is 4 nm/6 nm/6 nm. The transfer characteristics of the SONOS device at low and high $V_{ds}$ are given in FIG. 6.

More particularly, FIG. 13 illustrates programming curves of a SONOS cell (or of an average of 128 cells) in a 2T configuration with a 4 nm/6 nm/6 nm ONO stack using hot holes generated by impact ionisation. $V_{ag}$=1V, and the control gate voltage is varied. The starting $V_t$ of all curves in FIG. 13 is about 2 V. Geometry parameters are $L_{cg}$=0.1 μm, $L_{ag}$=0.2 μm. The read conditions are $V_{ds}$=0.5V, $V_{ag}$=1V, Iread=5 μA.

Figure 14:
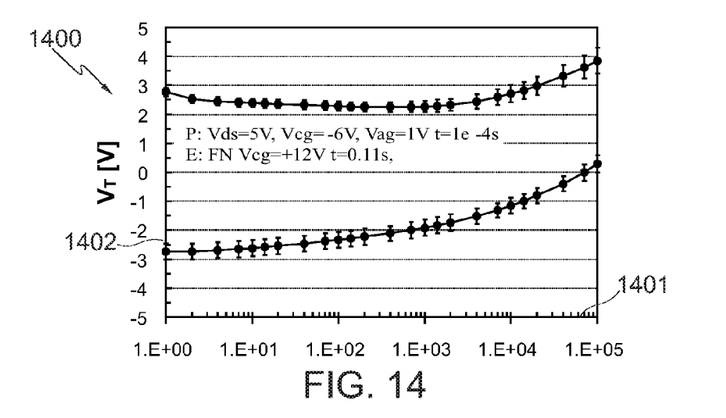
FIG. 14 illustrates endurance curves of the SONOS cell of FIG. 13.
Figure 15:
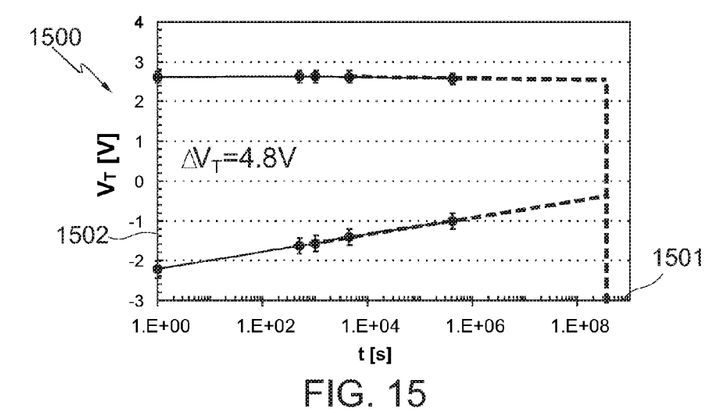
FIG. 15 illustrates retention measurements at 100° C. of the SONOS cell.

The endurance and retention curves are shown in FIG. 14 and FIG. 15, respectively.

Referring to FIG. 14, this figure shows a diagram 1400 having an abscissa 1401 along which a number of programming/erase cycles is plotted. Along an ordinate 1402, a threshold voltage is plotted. FIG. 14 therefore illustrates endurance curves of the SONOS cell presented in conjunction with FIG. 13 (4 nm/6 nm/6 nm ONO) programmed with hot holes generated by impact ionisation and erased by direct tunneling.

FIG. 15 illustrates a diagram 1500 having an abscissa 1501 along which the time is plotted in seconds. Along an ordinate 1502, the threshold voltage is plotted. A 60% remaining window after 10 years at 100° C. is plotted as well. Therefore, FIG. 15 shows retention measurements at 100° C. of a SONOS array with a 4 nm/6 nm/6 nm ONO programmed with hot holes generated by impact ionisation and erased by direct tunneling.

In the following, a further exemplary embodiment of the invention will be explained.

A corresponding device has a 2T configuration (access gate in series with a SONOS transistor) and may have similar properties as the above-described 2T device. In the above description, a voltage between +10 V and +20 V may be used for erasing in a non-selective way. Such a voltage may be generated on the chip, or supplied from outside. When the voltage is generated on the chip, a high voltage transistor to handle this voltage is needed to pass the voltage to the control gate. This may require few masks to create the high voltage transistors. In the presently described embodiment, all control gates are connected to a bond pad which may be ESD-protected, and a high voltage to erase (+10 V to +20 V) is supplied from outside to erase in a non-selective way all the cells (bring the threshold voltage to a high level). In this case, the selection during programming is done by the access gate and the bit line and not by the control gate. Since the voltages to be passed to the access gate and the bit line of the selected device are not too high ($V_{ag}$ may be approximately 1 V, $V_{ds}$ may be approximately 5 V), I/O transistors which may be available in a CMOS base line flow and may have some more thicker oxide compared to logic transistors (for instance 5 nm in a CMOS configuration) may be used to handle this voltage for a limited amount of time, which may be enough to perform one-time or multi-time programming of the memory.

Table 3 shows the conditions during programming, erasing and read when all the control gates are connected together to a bond pad to supply the high erase voltage from outside.

TABLE 3

Voltage requirements for programming, erasing and reading of a memory array using 2T configuration where all control gates are connected together according to the present embodiment.

| | WL selected | WL non selected | CG selected | CG non selected | BL selected | BL non selected | Vsource | Vbulk |
|---|---|---|---|---|---|---|---|---|
| Erase | 0 | Does not exist | +10 V to +20 V | Identical to selected CG (all are parallel) | 0 V | Does not exist | 0 V | 0 V |
| Program | 0.5 V to 3 V | 0 V | −3 V to −10 V | | +3 V to +6 V | 0 V | 0 V | 0 V |
| Read | 1 V to 3 V | 0 V | Vread | | 0.1 V to 1.5 V | 0 V | 0 V | 0 V |

According to another exemplary embodiment of the invention, the device is a 1T configuration operated by the programming scheme described above referring to Table 1. To make the programming even more robust and to limit the current during programming, a device acting like the current source (for instance a PMOS transistor) may be connected in series to the bit line in this embodiment. In this case, the memory may be programmed not with a voltage on the bit line but with a bit line current to better control the current flowing in a memory during programming. To reduce the current flowing in non-selected cells sharing the selected bit line (a high drain-source voltage may present on the drains so that they are punching and the gate voltage is 0 V to −2 V which may be not enough to switch off completely the cell), the memory array may be arranged in a NOR configuration with separated source lines and not common source line as shown in FIG. 16.

Figure 16:
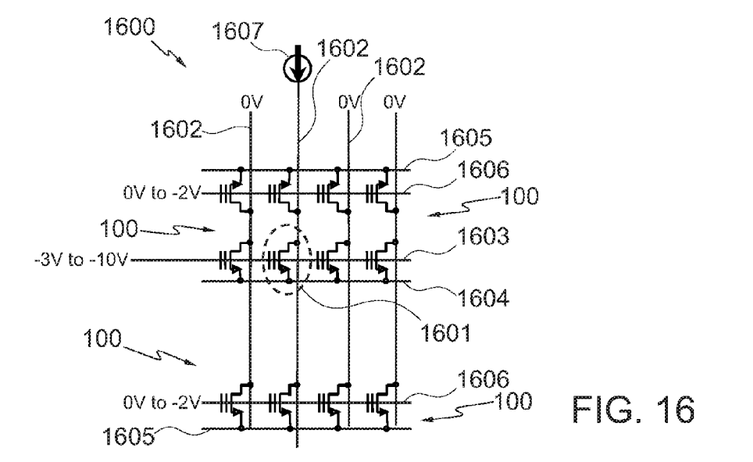
FIG. 16 schematically illustrates a circuit architecture of a 1T NOR configuration of a memory array according to an exemplary embodiment of the invention with separated source lines.

FIG. 16 therefore shows a memory array 1600 comprising a plurality of memory cells 100. A particularly memory cell 1601 is selected in the present embodiment. For this purpose, a current is applied to the corresponding one of bit lines 1602. A word line is denoted with reference numeral 1603 and a source line is denoted with reference numeral 1604. A line 1605 is floating, and a line 1606 may be brought to a potential of between 0 V and −2 V. The word line 1603 may be brought to a potential of −3 V to −10 V. A current source is denoted with reference numeral 1607.

Therefore, FIG. 16 shows a 1T-NOR configuration with the separated source lines 1604. The source lines 1604 are separated and are left floating for non-selected cells 100 during programming. The floating source lines 1604 may be charged to a few hundred mV and may act as back bias on the non-selected cells 100 of the bit line 1602 being programmed, hence the current in those cells 100 may be significantly reduced. The source line 1604 is running in the same direction as the word line 1603. The source line 1604 of all non-selected word lines 1603 are kept floating. During programming, the voltage of the source lines 1604 of non-selected word lines 1603 will increase a bit and will act as a back bias to reduce significantly the current flowing in non-selected cells 100 on the selected bit line 1602.

Embodiments of the invention may be applied to any product having an embedded or a stand-alone flash memory. Such products having embedded flash memories may be smartcards, electronic passports, etc. Many flash memory, OTP or MTP products are presently based on floating gate technology. The floating gate technology is however unfortunately not easily scaleable anymore below the 90 nm node especially in embedded applications. Therefore, alternatives are required. A serious candidate in the CMOS 45 nm generation and beyond is SONOS. However, SONOS has a serious drawback, which is retention due to its thin bottom oxide (approximately 2.5 nm). The bottom oxide thickness cannot be increased since hole tunneling may become very difficult when direct tunneling of Fowler-Nordheim mechanisms are used. Embodiments of the invention give an efficient way to program and erase a SONOS device having a thick bottom oxide. Direct or Fowler-Nordheim tunneling of electrons is still used but for erasing the whole memory in an unselective way. In this case, the threshold voltage of the memory may be brought to a higher voltage level. The programming may be done selectively by using hot holes generated by impact ionisation events of electrons flowing from source to drain. To enable the generation of hot holes by impact ionisation, the control gate, which is the SONOS device, should be punching at high source-drain voltages (that is used drain-source voltages for programming). In this way, the control gate device may be set to be very much off ($V_{cg} \ll 0$, for instance −5 V), but because the device is punching, electrons may flow from source to drain deep below the interface and get accelerated by the drain field due to one or more impact ionisation events on the way to the drain. When an impact ionisation event takes place, an electron-hole pair with certain energy may be created. The generated holes may get further acceleration by the gate field towards the gate, and some of them will overcome the oxide barrier and get trapped into the nitride or any other electrically insulating trapping layer. When the gate length is small enough, the whole nitride layer may be covered by hot holes in a very efficient way, so essentially all the trapped electrons over the channel may be erased. This may make the programming much more effective compared to programming with hot holes generated by band-to-band tunneling around the junction positions only. Direct improvements are faster programming and better endurance since all electrons in the channel may be removed after a programming action, so no accumulated electrons in the middle of the channel are present after cycling actions. When the control gate length is scaled down, the programming mechanism according to an exemplary embodiment of the invention gets more efficient since the whole nitride over the channel may be reached by hot holes in a more efficient way.

According to an exemplary embodiment, an access gate MOS transistor may be present next to every SONOS transistor, and used as a current limiter during programming. The access gate (which may have a selection function during read and/or write) may be often used in so-called 2T-NOR architectures to overcome over-erase related issues. According to such an embodiment, such a transistor may be used as a current limiter to program the SONOS transistor with hot holes generated by impact ionisation for better control of the programming process. In fact this may help fixing the amount of current that is desired to be spent during programming. Also this may reduce the spread in the current values needed to program punching control gates, since the access transistor is a very robust transistor (relatively long compared to the control transistor and not punching). To use the access transistor as a current limiter, it is possible to operate it in a situation during programming by applying an access gate voltage slightly higher than the threshold voltage of the access gate. A well-controllable electron current (between 1 $\mu$A/cell and 50 $\mu$A/cell depending on $V_{ag}$-$V_{tag}$) may flow and may generate hot holes by impact ionisation in the punching control gate channel region causing the programming of the SONOS. The access transistor may be also used for effective selection of the cells to be programmed. In fact, since the access transistor is a robust transistor, it may switch-off the current very efficiently when it is off, so the non-selected cells sharing the same bit line with the selected cells are not disturbed.

According to another exemplary embodiment, all control gates are connected together to a bond pad (probably ESD-protected). The high erase voltage may be supplied from outside. In this case, there is no need to have high voltage transistors on the chip and few masks are saved.

According to another exemplary embodiment, a device acting as a current limiter may be connected to every bit line to limit the programming current in a 1T NOR configuration with separated source lines running parallel to the word line. The source lines of the non-selected word lines are floating during programming to reduce or minimize power consumption.

Therefore, according to an exemplary embodiment of the invention, a programming scheme of an NMOS SONOS or charge trapping device in general with poly or metal gate may be provided. The programming may be done selectively by hot holes generated by impact ionisation events of electrons flowing from the source to drain of the SONOS transistor. To generate these hot holes and inject them in the trapping layer (for instance silicon nitride), the control gate is a punching device at the used $V_{ds}$ voltage during programming. The punching conditions may be defined as follows: A drain to source current $I_{ds}$ between 0.5 $\mu$A/$\mu$m and few hundred $\mu$A/$\mu$m is flowing when a high $V_{ds}$ is used (that is to say $V_{ds}$>2V) and when the transistor is normally off (that is to say $V_{gs} \leq 0V$). The erasing is done in a non-selective way by bringing the $V_t$ of all SONOS cells to a high $V_t$ level. This may be done by applying +10 V to +20 V to the control gate (depends on the ONO thickness) to have electrons tunneling by direct tunneling of Fowler-Nordheim mechanisms from the substrate to the charge trapping layer. The erase action may be done in a different non-selective way, for instance by illuminating the memory with UV light.

According to an exemplary embodiment of the invention, an access gate MOS transistor may be located next to every SONOS transistor, and may be used as a current limiter during programming by applying a voltage to the access transistor slightly higher than the access gate threshold voltage.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. A method of programming a memory cell, the method comprising:

applying a first electric potential to a first electric terminal of the memory cell;

applying a second electric potential to a second electric terminal of the memory cell;

applying a third electric potential to a third electric terminal of the memory cell, the first electric terminal separated from the third electric terminal by a channel region;

wherein applying the first electric potential and the third electric potential generates a flow of accelerated first charge carriers of a first type of conductivity from the third electric terminal to the first electric terminal, the flow of accelerated first charge carriers generating second charge carriers of a second type of conductivity by impact ionisation of the accelerated first charge carriers within the channel region;

wherein applying the second electric potential accelerates the second charge carriers to thereby inject the second charge carriers in a charge trapping structure of the memory cell;

wherein the first charge carriers are negatively charged particles, and wherein the second charge carriers are positively charged particles.

2. The method according to claim 1, wherein the first type of conductivity is different from the second type of conductivity.

3. The method according to claim 1, wherein a polarity of the first electric potential is opposite to a polarity of the second electric potential.

4. The method according to claim 1, wherein the first electric terminal is a first source/drain region, particularly is a drain region, of a memory transistor of the memory cell.

5. The method according to claim 1, wherein the second electric terminal is a gate region of a memory transistor of the memory cell.

6. The method according to claim 1, wherein the first electric potential is a positive electric potential, particularly is a positive electric potential having an absolute value in a range between 2 V and 6 V, more particularly of less than or equal to 5 V.

7. The method according to claim 1, wherein the second electric potential is a negative electric potential, particularly is a negative electric potential having an absolute value in a range between 3 V and 5 V.

8. The method according to claim 1, wherein the second electric potential is applied in such a manner that the second charge carriers are injected in the charge trapping structure after tunneling through an electrically insulating structure of the memory cell.

9. The method according to claim 8, wherein the electrically insulating structure of the memory cell has a thickness of at least 3 nm, particularly has a thickness in a range between 3 nm and 8 nm.

10. The method according to claim 1, wherein the charge trapping structure is electrically insulating, particularly comprises one of the group consisting of a silicon nitride layer, a silicon nitride layer of an ONO layer sequence, an ONO layer sequence comprising a high-k material, and a nanocrystal structure.

11. The method according to claim 1, comprising operating an access transistor of the memory cell as a current source for providing a current for programming the memory cell, particularly for limiting a current flowing through a memory transistor of the memory cell.

12. The method according to claim 1, wherein the memory cell is a non-volatile memory cell.

13. The method according to claim 4, wherein the third electric terminal is a second source/drain region, particularly is a source region, of a memory transistor of the memory cell.

14. The method according to claim 1, wherein a length of a gate stack of a memory transistor of the memory cell is less or equal to 150 nm.

15. The method according to claim 1, comprising erasing the memory cell by applying a forth electric potential to the second electric terminal of the memory cell, particularly by applying a forth electric potential to the second electric terminal of the memory cell having an absolute value which is larger than the absolute value of the second electric potential.

16. The method according to claim 15, comprising erasing a plurality of memory cells of a memory array simultaneously.

17. The method according to claim 1, wherein a memory transistor of the memory cell is a punching transistor.

18. A memory cell comprising:
a transistor including a first doped region, a second doped region, a gate region, and a channel region, the first doped region separated from the second doped region by the channel region;
a charge trapping structure disposed above the channel region and insulated from the channel region by a gate oxide layer;
a programming unit adapted for programming the memory cell by applying a first electric potential to the first doped region and by applying a third electric potential to the second doped region to accelerate electrons from the first doped region to the second doped region;
wherein the transistor is a punching transistor configured to allow electrons to flow from the first doped region to the second doped region through the channel region, wherein said electrons generate hot holes by impact ionisation of the electrons within the channel region;
wherein the programming unit is further adapted to apply a second electric potential to the gate region to accelerate the hot holes to tunnel through the gate oxide layer into the charge trapping layer.

19. A memory array, the memory array comprising a plurality of memory cells according to claim 18 formed in a common substrate.

20. The memory cell of claim 18, wherein the first doped region is a drain region and the second doped region is a source region.

21. The memory cell of claim 18, wherein a length of the gate region is less or equal to 150 nm, and wherein the insulating layer has a thickness of at least 3 nm.

* * * * *